United States Patent [19]
Dydyk

[11] Patent Number: 5,304,961
[45] Date of Patent: Apr. 19, 1994

[54] IMPEDANCE TRANSFORMING DIRECTIONAL COUPLER

[75] Inventor: Michael Dydyk, Scottsdale, Ariz.

[73] Assignee: Motorola, Inc., Schaumburg, Ill.

[21] Appl. No.: 859,743

[22] Filed: Mar. 30, 1992

[51] Int. Cl.$^5$ .................................................. H01P 5/16
[52] U.S. Cl. .................................... 333/112; 333/115; 333/116; 333/118
[58] Field of Search ............... 333/112, 118, 120, 124, 333/130, 131, 109, 113–117

[56] References Cited

U.S. PATENT DOCUMENTS

| | | | |
|---|---|---|---|
| 2,735,986 | 2/1956 | Hylas et al. | 333/120 |
| 3,484,724 | 12/1969 | Podell | 333/112 |
| 3,539,948 | 11/1970 | Salzberg | 333/112 |
| 3,723,914 | 3/1973 | Cappucci | 333/112 |
| 3,772,616 | 11/1973 | Imoto | 333/128 |
| 3,869,585 | 3/1975 | Snyder | 333/24 R |
| 4,305,043 | 12/1981 | Ho et al. | 330/53 |
| 4,893,098 | 1/1990 | Seely et al. | 333/112 |
| 5,045,821 | 9/1991 | Staudinger et al. | 333/118 |
| 5,124,674 | 6/1992 | Dydyk et al. | 333/112 X |

FOREIGN PATENT DOCUMENTS

| | | | |
|---|---|---|---|
| 154802 | 12/1980 | Japan | 333/117 |
| 75701 | 4/1984 | Japan | 333/120 |
| 84902 | 3/1989 | Japan | 333/116 |

OTHER PUBLICATIONS

Higgins, William T.; "Low Frequency Directional Couplers"; *Electrical Communicator;* Jul./Aug. 1967; pp. 3, 4.

An article entitled "Transform Impedance with a Branch Line Coupler," *Microwaves,* vol. 15, May 1976, pp. 47–52.

*Primary Examiner*—Benny Lee
*Attorney, Agent, or Firm*—Jeffrey D. Nehr

[57] ABSTRACT

A lumped impedance transforming directional coupler including a first reactive element, a second reactive element coupled to the first reactive element at a first port, a third reactive element coupled to the second reactive element at a second port, a fourth reactive element coupled to the first reactive element at a third port and to the first reactive element at a fourth port, and the first, the second, the third, and the fourth ports each coupled through a first, a second, a third, and a fourth capacitor, respectively, to electrical ground, the reactive elements and the capacitors providing impedance transformation. Alternate embodiments include a lumped element directional coupler arising from a distributed impedance transforming directional couplers with a pair of transmission lines one-fourth of a wavelength of a center operating frequency in length, and a second pair of transmission lines three-fourths of that wavelength in length.

19 Claims, 6 Drawing Sheets

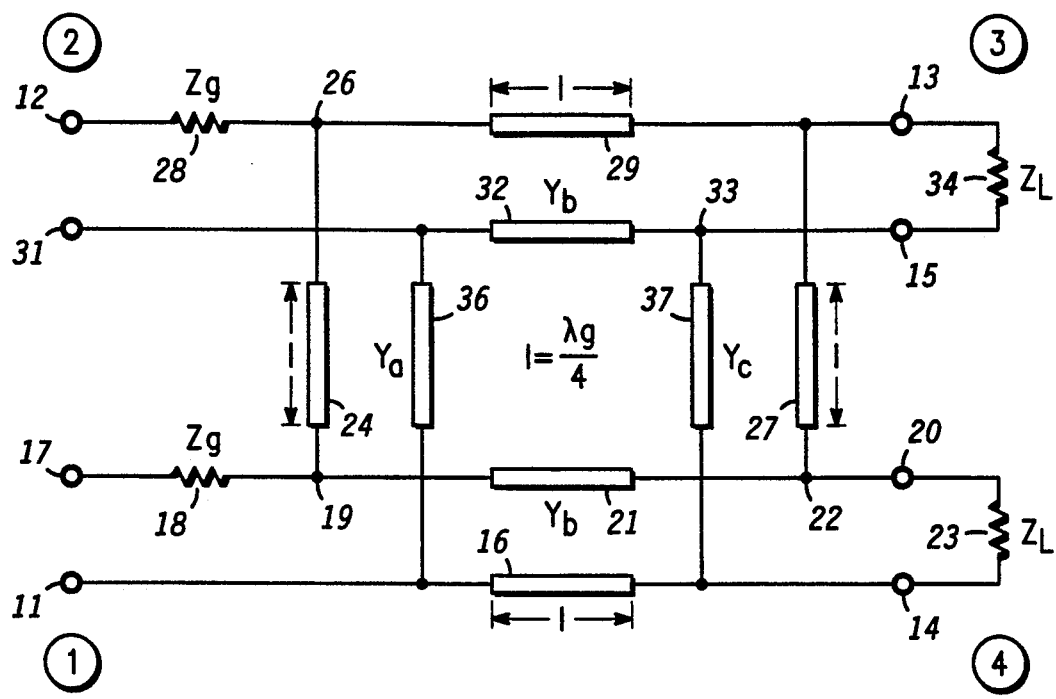
FIG. 1
-PRIOR ART-
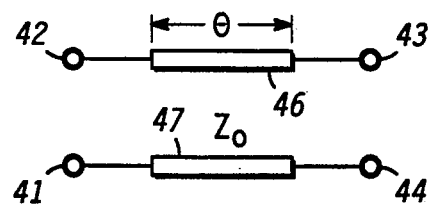
FIG. 2
FIG. 3
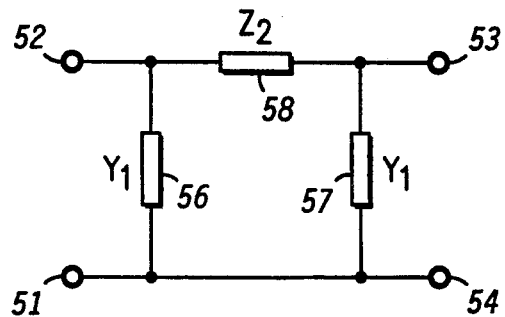

5,304,961

IMPEDANCE TRANSFORMING DIRECTIONAL COUPLER

BACKGROUND OF THE INVENTION

This invention relates in general to the field of directional couplers and, in particular, to directional couplers which incorporate the function of impedance transformation.

Branch line hybrid couplers are often used in a typical transistor amplifier combiner or balanced mixer. These couplers are traditionally designed with four, 50-ohm ports to match the system impedance. However, radio frequency (RF), microwave, and millimeter-wave frequencies active devices used in power amplifiers, mixers, or other applications in which the coupler may be found may present impedances in the range of approximately 1 to 200 ohms.

The range of impedances which the coupler must accommodate typically necessitates the use of impedance transformers that, in either the distributed or lumped domain, increase the size, weight and insertion loss of the device.

Thus, what is needed is a practical, economical directional coupler which incorporates the function of impedance transformation. The relatively small size transforming directional coupler would be realizable in monolithic microwave integrated circuit (MMIC) form.

SUMMARY OF THE INVENTION

Accordingly, it is an advantage of the present invention to provide a new and improved apparatus for impedance transformation in a directional coupler. It is a further advantage of the present invention to provide a method to design a lumped element impedance transforming directional coupler based on a distributed design. It is still a further advantage of the present invention to provide apparatus for impedance transformation in distributed directional couplers.

To achieve these advantages, a lumped impedance transforming directional coupler is contemplated which includes a first reactive element, a second reactive element coupled to the first reactive element at a first port, a third reactive element coupled to the second reactive element at a second port, a fourth reactive element coupled to the first reactive element at a third port and to the first reactive element at a fourth port, and the first, the second, the third, and the fourth ports each coupled through a first, a second, a third, and a fourth capacitor, respectively, to an electrical ground, the first, the second, the third, and the fourth reactive elements and the first, the second, the third, and the fourth capacitors providing impedance transformation with other circuits.

In addition, a distributed impedance transforming directional coupler is contemplated, including a first port, a second port, a first transmission line coupled between the first port and the second port, the first transmission line one-fourth of a wavelength of a center operating frequency in length, a third port, a second transmission line coupled between the second port and the third port, the second transmission line three-fourths of the wavelength of the center operating frequency in length, a fourth port, and, a third transmission line coupled between the fourth port and the third port, the third transmission line one-fourth of the wavelength of the center operating frequency in length, a fourth transmission line coupled between the fourth port and the first port, the fourth transmission line three-fourths of the wavelength of the center operating frequency in length, the first, the second, the third, and the fourth transmission lines providing impedance transformation with other circuits.

The above and other features and advantages of the present invention will be better understood from the following detailed description taken in conjunction with the accompanying drawings.

BRIEF DESCRIPTION OF THE DRAWINGS

In FIG. 1, there is shown a circuit schematic of a first distributed impedance transforming hybrid coupler of transmission lines in accordance with the prior art.

In FIG. 2, there is shown the equivalent circuit of a transmission line in the distributed domain.

In FIG. 3, there is shown the equivalent circuit of a transmission line in the lumped domain.

DETAILED DESCRIPTION OF THE PREFERRED EMBODIMENTS

Figure 4:
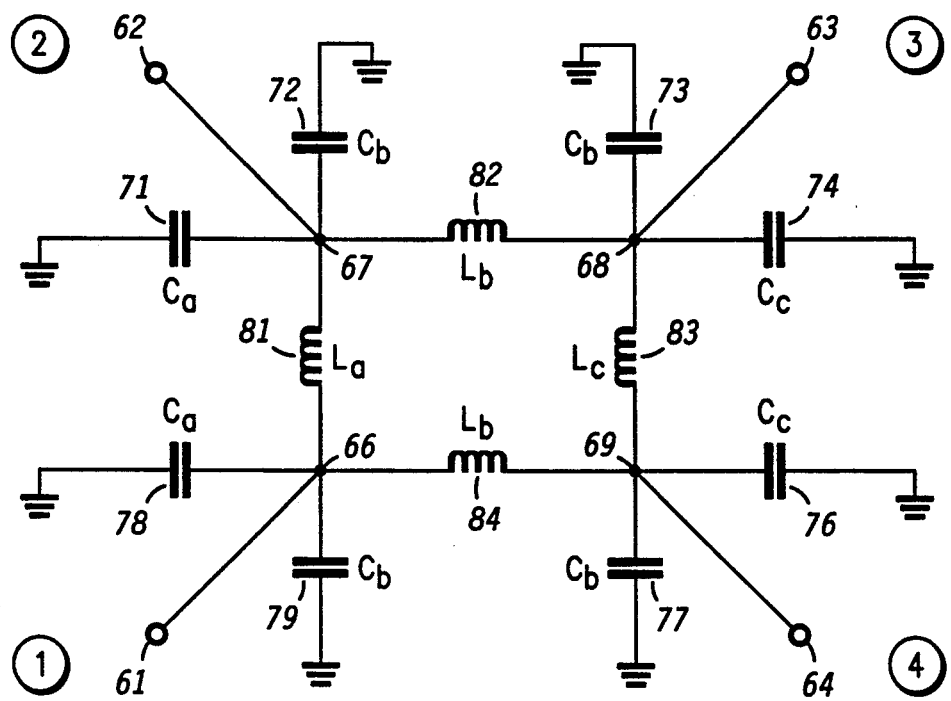
In FIG. 4, there is shown a first lumped element transforming hybrid coupler in accordance with a preferred embodiment of the invention.

A distributed transforming branch line hybrid has been discussed in Chen Y. Ho, "Transform Impedance with a Branch Line Coupler," Microwaves, vol. 15, May 1976, pp. 47–52. In FIG. 1, there is shown a circuit schematic of a first distributed impedance transforming hybrid coupler of transmission lines as in Ho. The distributed transforming hybrid comprises four transmission lines with different characteristic impedances, with each transmission line a quarter wavelength long at the center frequency of operation of the directional coupler.

Note in the following description "port 1" appears in the figures as a "1" enclosed in a circle. Similarly, "port 2" is represented in the figures as a "2" within a circle, "port 3" is represented in the figures as a "3" within a circle, and "port 4? is represented in the figures as a "4" within a circle. Also note that identically labelled elements in multiple figures refer to the same element.

Specifically, port 1 of the coupler 10 in FIG. 1 is shown schematically by the combination of connections 11 and 17, port 2 by the combination of connections 12 and 31, port 3 by connections 13 and 15 and port 4 by connections 14 and 20. Connection 12 of port 2 is coupled through impedance 28, with value $Z_g$, to junction 26. Junction 26 is coupled through transmission line portion 29 to connection 13. The transmission line represented by portion 29 and portion 32 is of length 1, which is one-quarter wavelength long at the center operating frequency of the directional coupler.

Connection 31 is coupled through transmission line portion 32 to junction 33. The admittance of the transmission line represented by portions 29 and 32 is $Y_b$. Junction 33 is coupled to connection 15. Load impedance 34, of value $Z_L$, is shown coupled between connections 13 and 15.

Connection 31 is also coupled through transmission line portion 36 to connection 11. Junction 26 is coupled through transmission line portion 24 to junction 19. The transmission line of length $l = \lambda g/4$ represented by portions 24 and 36 is one-quarter of a wavelength long at the center operating frequency of the coupler, with admittance $Y_a$.

Connection 17 is coupled through impedance 18, of value $Z_g$, to junction 19. Junction 19 is coupled through transmission line portion 21 to junction 22. Connection 11 is coupled through transmission line portion 16 to connection 14. Connection 14 is coupled through impedance 23, of value $Z_L$, to junction 22. The transmission line of length $l = \mu g/4$ represented by portions 16 and 21 is one-quarter of a wavelength long at the center operating frequency of the coupler, with admittance $Y_b$.

Connection 14 is coupled through transmission line portion 37 to junction 33. Junction 22 is coupled through transmission line of length $l = \lambda g/4$ portion 27 to connection 13. The transmission line represented by portions 37 and 27 is one-quarter of a wavelength long at the center operating frequency of the coupler, with admittance $Y_c$. Junction 22 is coupled to connection 20.

The ABCD matrix analysis tool can be used to develop an equivalency between the distributed and lumped circuit domain. An equivalency can first be established between the distributed and lumped domain representations of a transmission line, followed by a lumped domain version of the distributed version of a circuit as in FIG. 1.

FIG. 2 shows the equivalent circuit of a transmission line in the distributed domain. Between connections 42 and 43 and 41 and 44 are transmission line portions 46 and 47, respectively. The transmission line represented by portions 46 and 47 is of length $\theta$, impedance $Z_O$, and admittance.

FIG. 3 shows the equivalent circuit of the transmission line of FIG. 2 in the lumped domain. Connection 52 is coupled through impedance 58, of value $Z_2$, to connection 53. Connection 51 is coupled through admittance 56, of value $Y_1$, to connection 52. Connection 54 is coupled through admittance 57, of value $Y_1$, to connection 53. Connection 51 is also coupled to connection 54.

The ABCD matrix for the distributed version of the transmission line in FIG. 2 is:

$$\begin{bmatrix} AB \\ CD \end{bmatrix}_{Distributed} = \begin{bmatrix} \cos\theta & jZ_o\sin\theta \\ jY_o\sin\theta & \cos\theta \end{bmatrix} \quad \text{(Equation 1)}$$

The ABCD matrix for the lumped version of the transmission line in FIG. 3 is:

$$\begin{bmatrix} AB \\ CD \end{bmatrix}_{Lumped} = \begin{bmatrix} 1 + Y_1Z_2 & Z_2 \\ Y_1(2 + Y_1Z_2) & 1 + Y_1Z_2 \end{bmatrix} \quad \text{(Equation 2)}$$

Assuming that the lumped representation comprises two shunt capacitors separated by an inductor and that the transmission line is evaluated at the center frequency of operation of the coupler, i.e., ($\omega_0$, Equations 1 and 2 become Equations 3 and 4, respectively, below:

$$\begin{bmatrix} AB \\ CD \end{bmatrix}_{Distributed} = \begin{bmatrix} 0 & jZ_o \\ jY_o & 0 \end{bmatrix} \quad \text{(Equation 3)}$$

$$\begin{bmatrix} AB \\ CD \end{bmatrix}_{Lumped} = \begin{bmatrix} 1 - \omega^2 C_o L_o & j\omega L_o \\ j\omega C_o(2 - \omega^2 L_o C_o) & 1 - \omega^2 L_o C_o \end{bmatrix} \quad \text{(Equation 4)}$$

where $C_0$ and $L_0$ are lumped element capacitance and inductance equivalents and $\omega$ is the operating frequency.

Equating the AB elements of each matrix yields:

$$1 = \omega^2 L_0 C_0 \quad \text{(Equation 5)}$$

$$\omega L_0 = Z_0 \quad \text{(Equation 6)}$$

Thus, $$\omega C_0 = Y_0 \quad \text{(Equation 7)}$$

Using Equations 6 and 7 and the results of Ho, a lumped element transforming hybrid in accordance with the invention can be deduced, as shown in FIG. 4.

The first, second, third, and fourth ports of the lumped element impedance transforming hybrid in FIG. 4 are shown by connections 61, 62, 63, and 64, respectively. Reactive elements are coupled in a ring as follows: inductance 81 of value $L_a$ is coupled between node 66 and node 67, inductance 82 of value $L_b$ is coupled between node 67 and node 68, inductance 83 of value $L_c$ is coupled between node 68 and node 69, and inductance 84 of value $L_b$ is coupled between node 69 and node 66.

Each of the nodes in FIG. 4 is also coupled through reactive elements to electrical ground as follows: node 66 is coupled through capacitor 79, with capacitance $C_b$, to electrical ground and also through capacitor 78, with capacitance $C_a$, to electrical ground; node 67 is coupled through capacitor 72, with capacitance $C_b$, to electrical ground and also through capacitor 71, with capacitance $C_a$, to electrical ground; node 68 is coupled through capacitor 73, with capacitance $C_b$, to electrical ground and also through capacitor 74, with capacitance $C_c$, to electrical ground; and, node 69 is coupled through capacitor 77, with capacitance $C_b$, to electrical ground and also through capacitor 76, with capacitance $C_c$, to electrical ground.

In addition, port I is coupled to node 66, port 2 is coupled to node 67, port 3 is coupled to node 68, and port 4 is coupled to node 69, forming the four ports of the impedance transforming directional coupler. The capacitance and inductance values associated with the elements in FIG. 4 is as follows:

$$\omega C_a = Y_g/k \qquad \text{(Equation 8)}$$

$$\omega L_a = Z_g k \qquad \text{(Equation 9)}$$

$$\omega C_b = \sqrt{Y_g Y_L (1 + 1/k^2)} \qquad \text{(Equation 10)}$$

$$\omega L_b = \sqrt{\frac{Z_g Z_L}{1 + 1/k^2}} \qquad \text{(Equation 11)}$$

$$\omega C_c = Y_L/k \qquad \text{(Equation 12)}$$

$$\omega L_c = k Z_L \qquad \text{(Equation 13)}$$

where $Y_g$ is the admittance associated with impedance $Z_g$, $Y_L$ is the admittance associated with impedance $Z_L$, and k is the absolute value of the ratio of scattering parameters $S_{13}/S_{14}$.

Figure 5:
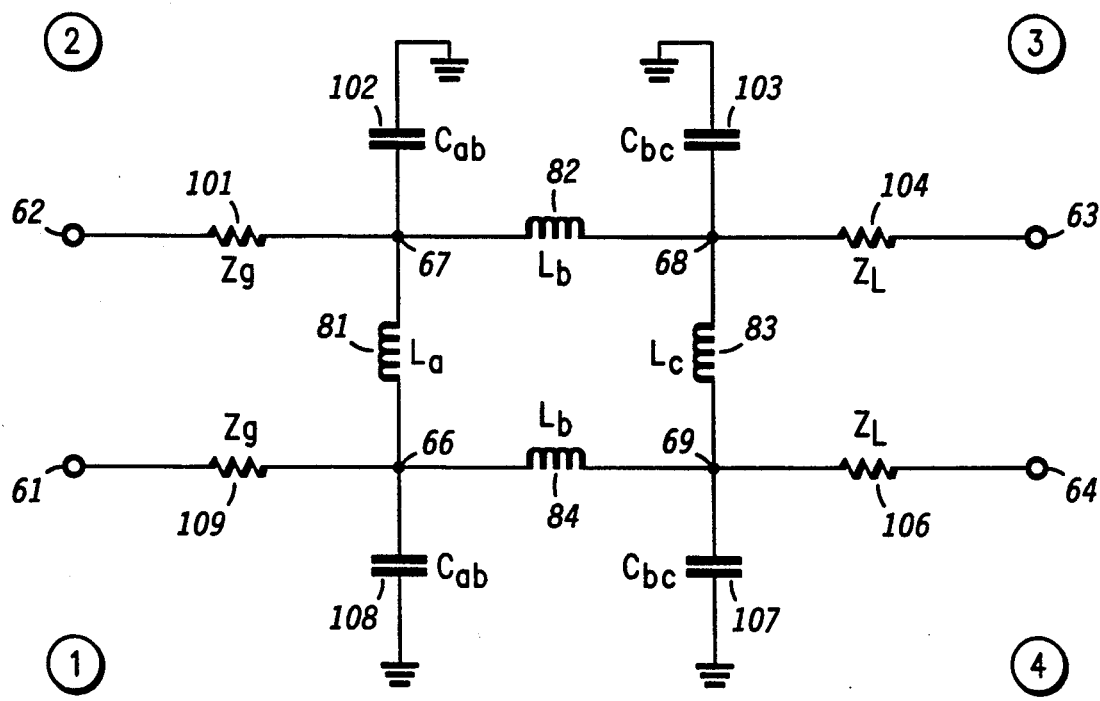
In FIG. 5, there is shown the lumped element transforming coupler of FIG. 5 with capacitors combined.

The pairs of capacitors between nodes 66, 67, 68, and 69 and electrical ground in FIG. 4 can be combined to form the simplified equivalent circuit in FIG. 5. The circuit in FIG. 5 is similar to the circuit in FIG. 4, with the exception that capacitors 71, 72, 73, 74, 76, 77, 78 and 79 have been eliminated, and impedances 101, 104, 106 and 109 and capacitors 102, 103, 107, and 108 have been added.

In FIG. 5, impedance 101, of value $Z_g$, is coupled between connection 62 and node 67. Capacitor 102, with value $C_{ab}$, is coupled between node 67 and electrical ground. Impedance 104, of value $Z_L$, is coupled between connection 63 and node 68. Capacitor 103, with value $C_{bc}$, is coupled between node 68 and electrical ground. Impedance 106, of value $Z_L$, is coupled between connection 64 and node 69. Capacitor 107, with value $C_{bc}$, is coupled between node 69 and electrical ground. Impedance 109, of value $Z_g$, is coupled between connection 61 and node 66. Capacitor 108, with value $C_{ab}$, is coupled between node 66 and electrical ground.

In the case of FIG. 5:

$$\omega C_{ab} = \omega(C_a + C_b) = \frac{Y_g}{k}\left[1 + \sqrt{\frac{Y_L}{Y_g}(1 + k^2)}\right] \qquad \text{(Equation 14)}$$

$$\omega C_{bc} = \omega(C_b + C_c) = \frac{Y_L}{k}\left[1 + \sqrt{\frac{Y_g}{Y_L}(1 + k^2)}\right] \qquad \text{(Equation 15)}$$

For equal power split between ports 3 and 4 of the hybrid in FIG. 5:

$$k = 1 \qquad \text{(Equation 16)}$$

The transforming hybrid elements become:

$$\omega L_a = Z_g \qquad \text{(Equation 17)}$$

-continued $$\omega L_b = \sqrt{\frac{Z_g Z_L}{2}} \qquad \text{(Equation 18)}$$

$$\omega L_c = Z_L \qquad \text{(Equation 19)}$$

$$\omega C_{ab} = Y_g(1 + \sqrt{2Y_L/Y_g}) \qquad \text{(Equation 20)}$$

$$\omega C_{bc} = Y_L(1 + \sqrt{2Y_g/Y_L}) \qquad \text{(Equation 21)}$$

Figure 6:
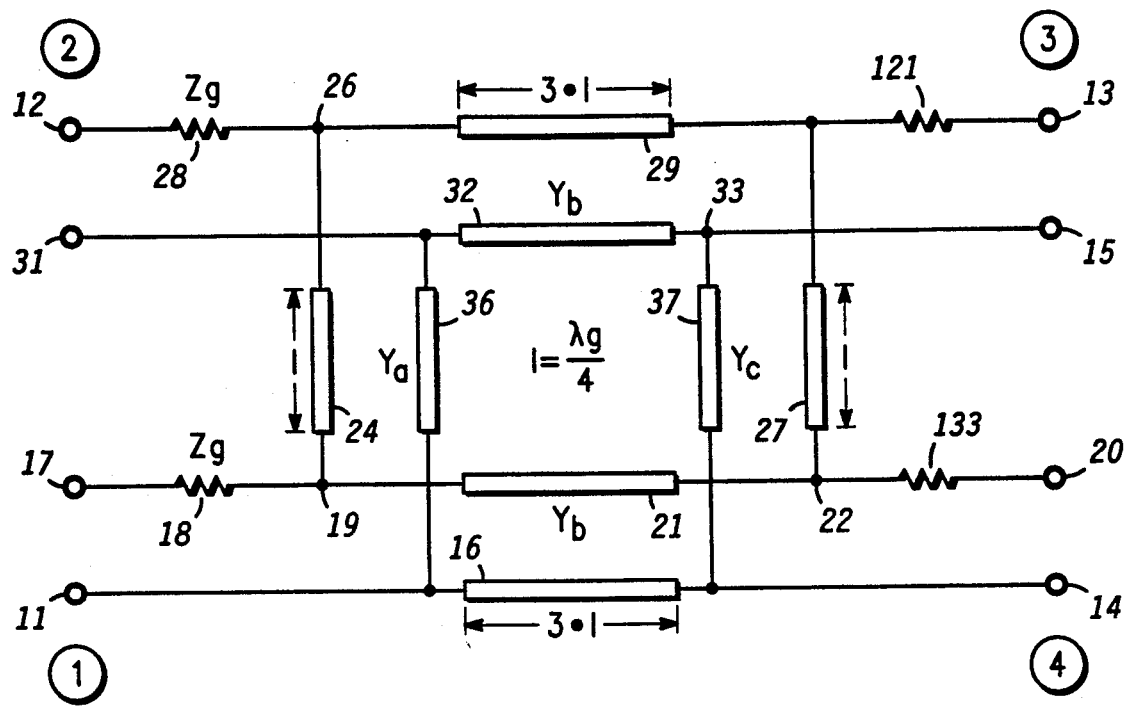
In FIG. 6, there is shown a second distributed impedance transforming branch line hybrid coupler in accordance with a preferred embodiment of the invention.

In FIG. 6, there is shown a second distributed impedance transforming branch line coupler of transmission lines. The FIG. 6 circuit is similar to the distributed impedance transforming hybrid coupler of FIG. 1, except that the lengths of transmission line portions 29, 32, 21 and 16 are three-fourths of the wavelength at the center operating frequency, i.e. 3 times or 3 · impedance 121 is coupled between transmission line portion 29 and connection 13, impedance 133 is coupled between junction 22 and connection 20, and the load impedances 34 and 23 of FIG. 1 are not shown.

Figure 7:
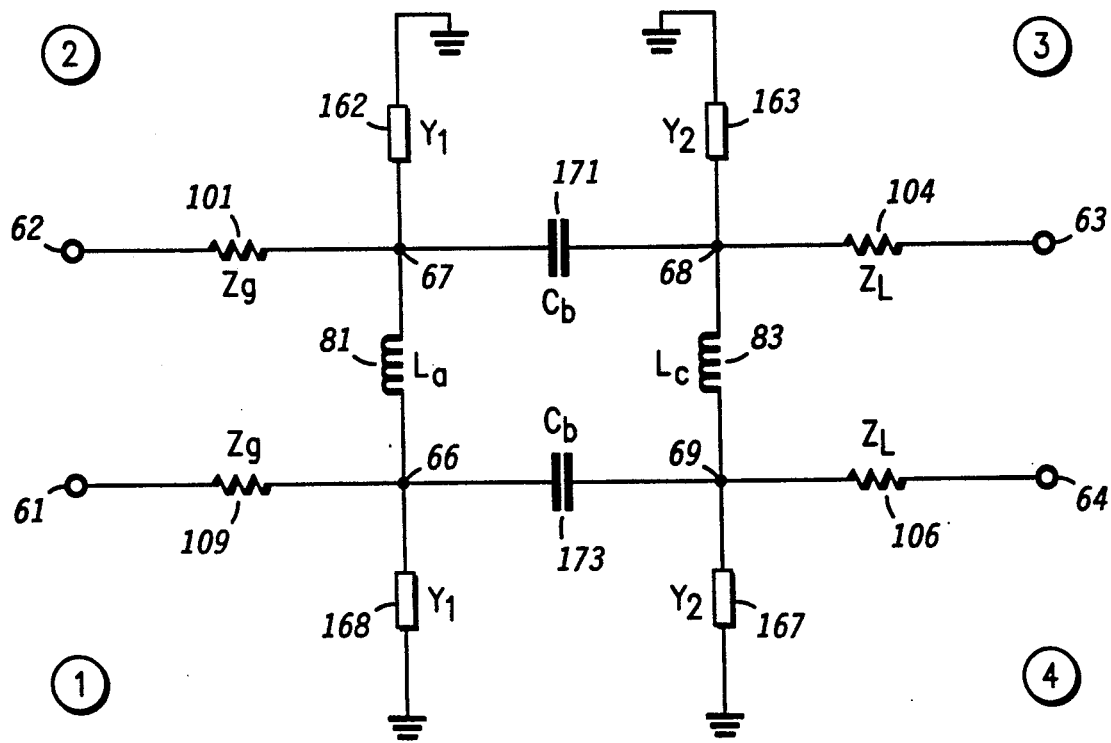
In FIG. 7, there is shown a second lumped element transforming hybrid coupler in accordance with a preferred embodiment of the invention.

FIG. 7 shows a second lumped element transforming hybrid coupler embodiment in accordance with the invention which corresponds to the distributed version of FIG. 6. The resulting FIG. 7 circuit is similar to the FIG. 5 circuit except: admittance 162, of value $Y_1$, replaces capacitor 102; admittance 168, of value $Y_1$, replaces capacitor 108; admittance 163, of value $Y_2$, replaces capacitor 103; admittance 167, of value $Y_2$, replaces capacitor 107; capacitor 171, of capacitance $C_b$, replaces inductor 82; and, capacitor 173, of capacitance $C_b$, replaces inductor 84.

The transforming hybrid elements for FIG. 7 are:

$$\omega L_a = k Z_g \qquad \text{(Equation 22)}$$

$$\omega C_b = \sqrt{Y_g Y_L (1 + 1/k^2)} \qquad \text{(Equation 23)}$$

$$\omega L_c = k Z_L \qquad \text{(Equation 24)}$$

$$Y_1 = \frac{Y_g}{k}\left[1 - \sqrt{\frac{Y_L}{Y_g}(1 + k^2)}\right] \qquad \text{(Equation 25)}$$

$$Y_2 = \frac{Y_L}{k}\left[1 - \sqrt{\frac{Y_g}{Y_L}(1 + k^2)}\right] \qquad \text{(Equation 26)}$$

Figure 8:
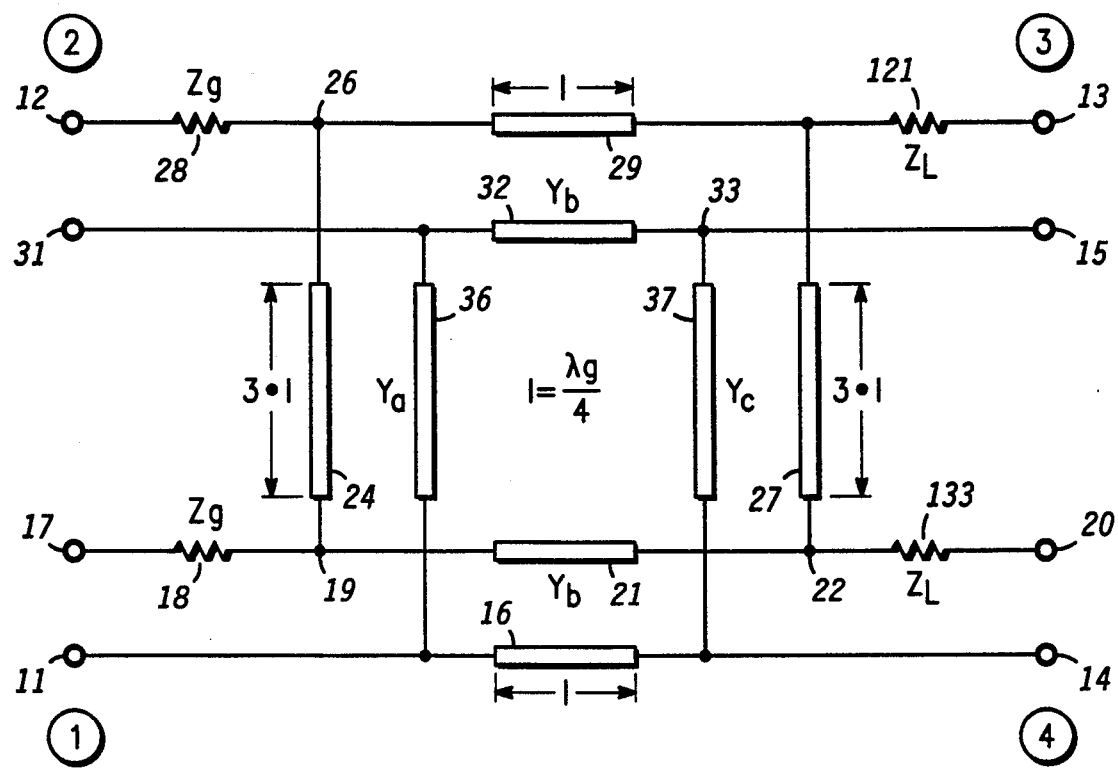
In FIG. 8, there is shown a third distributed impedance transforming hybrid coupler of transmission lines in accordance with a preferred embodiment of the invention.

In FIG. 8, there is shown a third distributed impedance transforming hybrid coupler of transmission lines. The FIG. 8 distributed coupler is similar to the distributed coupler in FIG. 6, except that the transmission line portions 29, 32, 21, and 16 are one-fourth of the wavelength at the center operating frequency, and transmission line portions 24, 36, 37, and 27 are three-fourths the wavelength at the center operating frequency.

Figure 9:
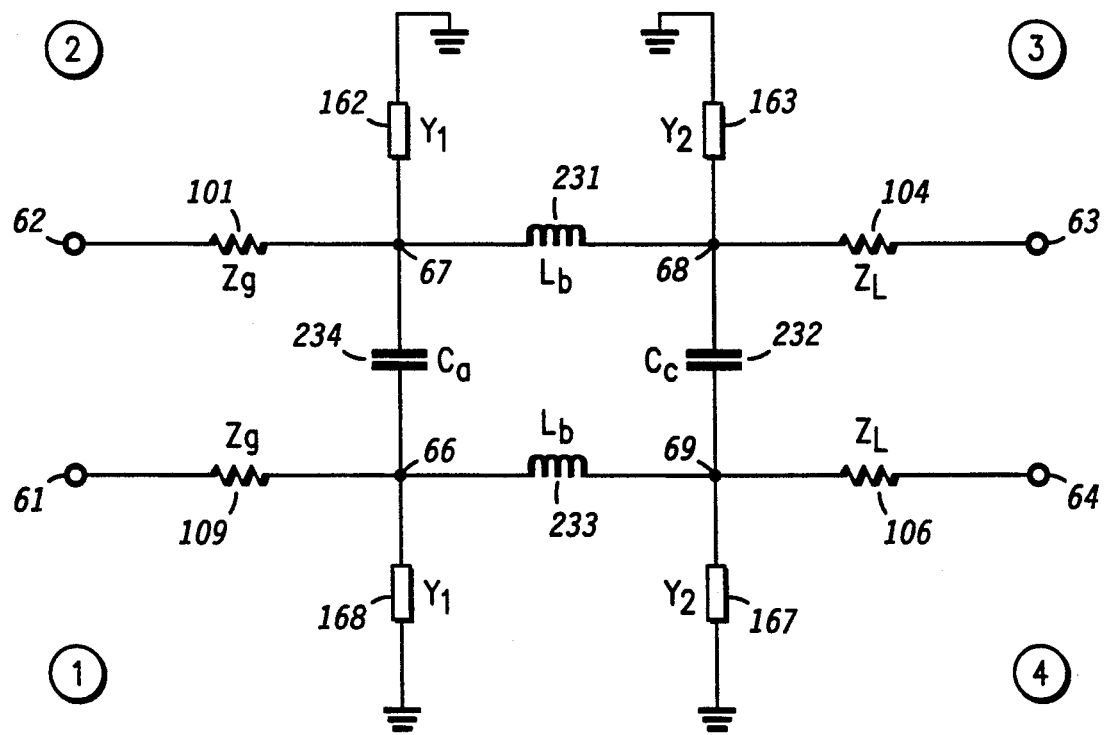
In FIG. 9, there is shown a third lumped element transforming hybrid coupler in accordance with a preferred embodiment of the invention.

In FIG. 9, there is shown a third lumped element transforming hybrid coupler which corresponds to the distributed version in FIG. 8. The distributed coupler in FIG. 9 is similar to the distributed coupler in FIG. 7, except that: capacitor 234 of capacitance $C_a$ replaces inductor 81; capacitor 232 of capacitance $C_c$ replaces inductor 83; inductor 231 of inductance $L_b$ replaces capacitor 171; and, inductor 233 of inductance $L_b$ replaces capacitor 173.

The transforming hybrid elements for FIG. 9 are:

$$\omega C_a = kY_g \quad \text{(Equation 27)}$$

$$\omega L_b = \sqrt{\frac{Z_L Z_g}{(1 + 1/k^2)}} \quad \text{(Equation 28)}$$

$$\omega C_c = Y_L/k \quad \text{(Equation 29)}$$

$$Y_1 = \frac{Y_g}{k}\left[\sqrt{\frac{Y_L}{Y_g}(1 + k^2)} - 1\right] \quad \text{(Equation 30)}$$

$$Y_2 = \frac{Y_L}{k}\left[\sqrt{\frac{Y_g}{Y_L}(1 + k^2)} - 1\right] \quad \text{(Equation 31)}$$

Figure 10:
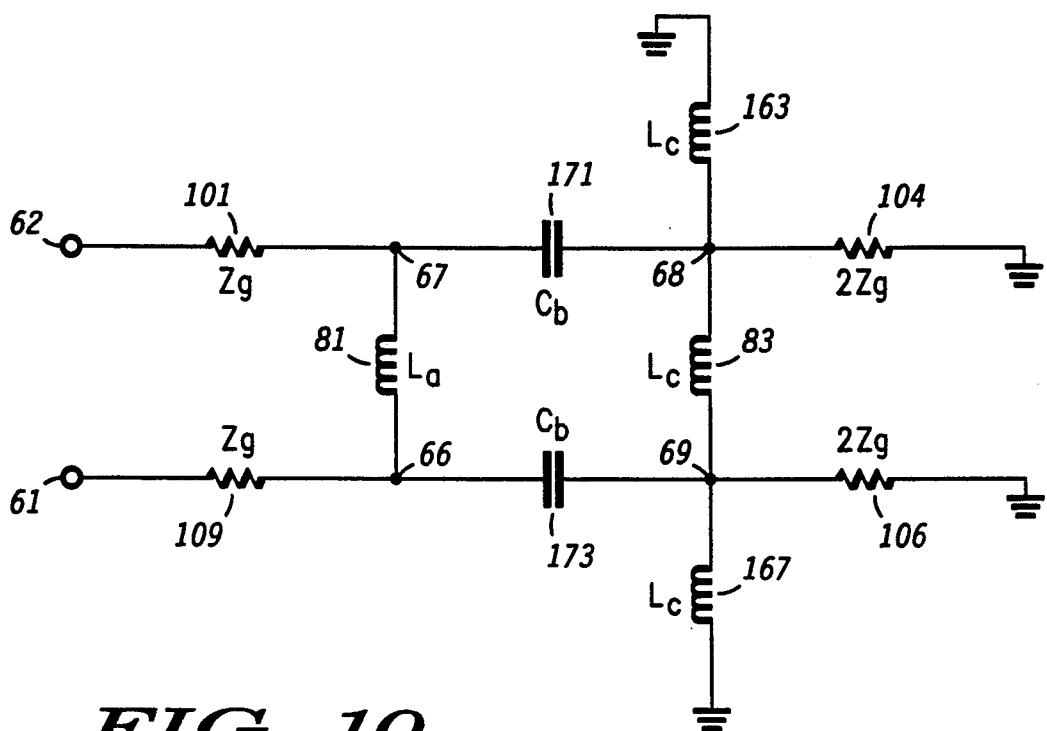
In FIG. 10, there is shown a lumped element transforming hybrid coupler with a load-generator impedance ratio of 2:1 in accordance with a preferred embodiment of the invention.

FIG. 10 represents the lumped element coupler in FIG. 7 in the special case when the load-generator impedance ratio is 2:1. The number of components of the lumped element coupler is reduced. The circuit is similar to for FIG. 7, except that admittances 162 and 168 are eliminated, and the impedances 104 and 106 are each equal to 2 $Z_g$. In addition, admittances 163 and 167 each can be an inductor with an inductance of $L_c$.

Figure 11:
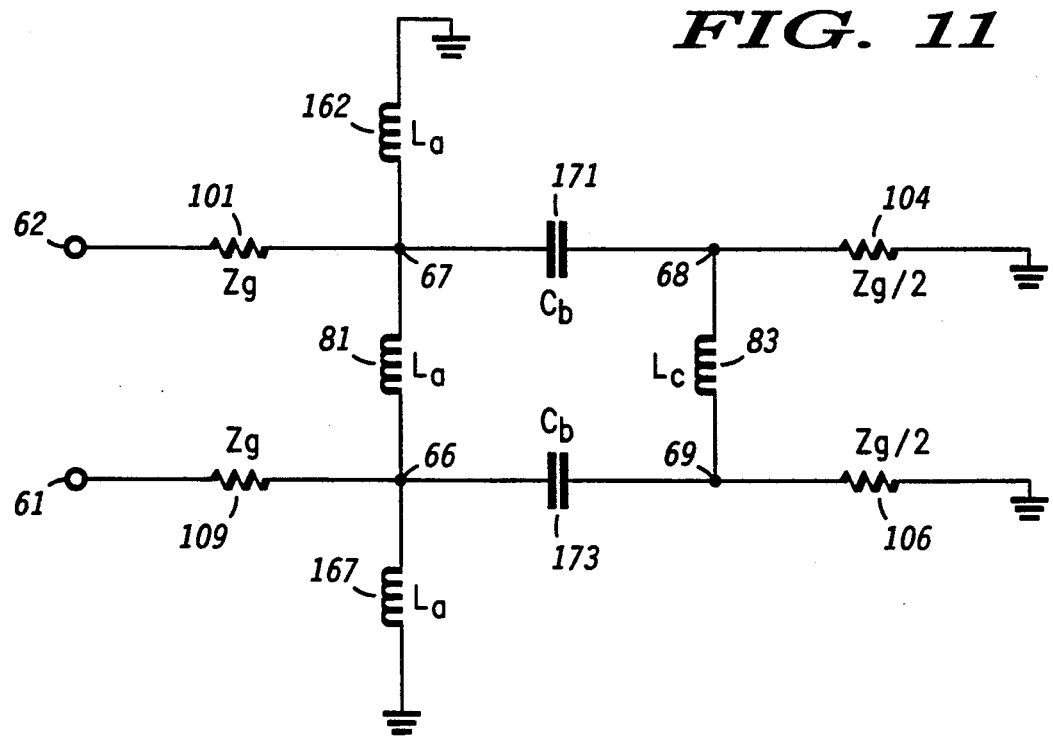
In FIG. 11, there is shown a lumped element transforming hybrid coupler with a load-generator impedance ratio of 1:2 in accordance with a preferred embodiment of the invention.

Similarly, FIG. 11 represents the lumped element coupler in FIG. 7 in the special case when the load-generator impedance ratio is 1:2. The number of components of the lumped element coupler is also reduced for this special case. The circuit is similar to for FIG. 7, except that admittances 163 and 167 are eliminated, and the impedances 104 and 106 are each equal to $Z_g/2$. In addition, admittances 162 and 167 each can be an inductor with an inductance of $L_a$.

Figure 12:
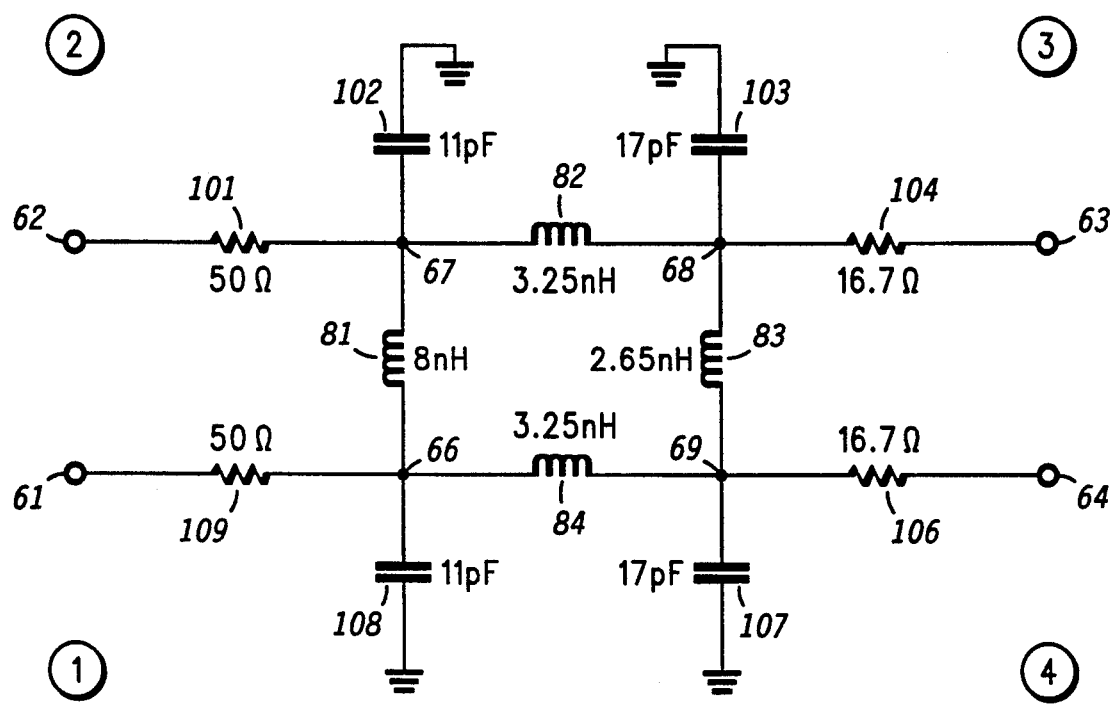
In FIG. 12, there is shown a lumped element transforming hybrid coupler with a load-generator impedance ratio of 3:1 for 1 gigahertz (GHz) operation in accordance with a preferred embodiment of the invention.

As an example of the implementation of a lumped element impedance transforming coupler in accordance with the invention, FIG. 12 shows such a coupler of the first kind described (as in FIG. 5) with a load-generator impedance ratio of 3:1 for 1 gigahertz (GFU) operation. Exemplary values are as follows:

$$k = 1 \quad \text{(Equation 32)}$$

$$Z_g/Z_L = 3 \quad \text{(Equation 33)}$$

$$Z_g = 50 \text{ohms} \quad \text{(Equation 34)}$$

$$\omega/2\pi = 1.0\text{GHz} \quad \text{(Equation 35)}$$

Using Equations 17-21 results in the following for the FIG. 12 implementation:

$$L_a = 8.0\text{nH} \quad \text{(Equation 36)}$$

$$L_b = 3.25\text{nH} \quad \text{(Equation 37)}$$

$$L_c = 2.65\text{nH} \quad \text{(Equation 38)}$$

$$C_{ab} = 11.0\text{pF} \quad \text{(Equation 39)}$$

$$C_{bc} = 17.0\text{pF} \quad \text{(Equation 40)}$$

Typical inductances for MMIC implementations are approximately 0.2 to 15 nH. Typical capacitances for MMIC implementations are approximately 0.5 to 20 pF. Thus, impedance transforming directional couplers have been described which overcome specific problems and accomplish certain advantages relative to prior art methods and mechanisms. The directional couplers contemplated can be used for impedance transformation to equal or unequal input and output impedances of approximately 1-200 ohms. The directional couplers described exhibit directivity and isolation while incorporating the function of impedance matching.

The lumped element directional couplers reduce the size of the required circuit and are compatible with MMICS. The directional couplers can be designed for frequencies from about 0.5 to 20 GHz. Beyond about 20 GHz, the distributed versions of the directional couplers can be used. The directional couplers can be cascaded for broader bandwidth, and are suitable for use in balanced power amplifiers, mixers, and other applications.

Thus, impedance transforming directional couplers have been described which fully satisfy the aims and advantages set forth above. While the invention has been described in conjunction with specific embodiments, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

I claim:

1. A lumped element impedance transforming four-port directional coupler comprising:
   a first reactive element;
   a second reactive element coupled to the first reaction element at a first port;
   a third reactive element coupled to the second reactive element at a second port;
   a fourth reactive element coupled to the third reactive element at a third port and to the first reactive element at a fourth port, such that the first reactive element is coupled between the first and fourth ports, the second reactive element is coupled between the first and second ports, the third reactive element is coupled between the second and third ports, and the fourth reactive element is coupled between the third and fourth ports;
   the first, the second, the third, and the fourth ports each coupled through a first, a second, a third, and a fourth capacitor, respectively, to an electrical ground;
   the first, the second, the third, and the fourth ports each additionally coupled through a fifth, a sixth, a seventh, and an eighth capacitor, respectively, to the electrical ground; and
   the first, the second, the third, and the fourth reactive elements and the first, the second, the third, the fourth, the fifth, the sixth, the seventh, and the eighth capacitors providing impedance transformation for the four-port directional coupler.

2. A lumped element directional coupler as claimed in claim 1, wherein the first and the third reactive elements comprise inductors with approximately equal inductances.

3. A lumped element directional coupler as claimed in claim 1, wherein each of the first, the second, the third, and the fourth capacitors have a first capacitance value.

4. A lumped element directional coupler as claimed in claim 3, wherein each of the fifth and the sixth capacitors have a second capacitance value and each of the seventh and eighth capacitors have a third capacitance value.

5. A lumped element impedance transforming four-port directional coupler comprising:
   a first reactive element;

a second reactive element coupled to the first reactive element at a first node;

a third reactive element coupled to the second reactive element at a second node;

a fourth reactive element coupled to the third reactive element at a third node and to the first reactive element at a fourth node, such that the first reactive element is coupled between the first and fourth nodes, the second reactive element is coupled between the first and second nodes, the third reactive element is coupled between the second and third nodes, and the fourth reactive element is coupled between the third and fourth nodes;

the first and the second nodes coupled through a first and a second inductor, respectively, to an electrical ground; and a first port, a second port, a third port, and a fourth port coupled through a first impedance, a second impedance, a third impedance, and a fourth impedance, respectively, to the first node, the second node, the third node and the fourth node, respectively, providing impedance transformation for the four-port directional coupler.

6. A lumped element directional coupler as claimed in claim 5, wherein:

the first and second impedances each have a first impedance value;

the third and the fourth impedances each having a second impedance value of approximately one-half the first impedance value;

the first reactive element and the third reactive element comprise capacitors each having approximately equal capacitance; and the second reactive element and the fourth reactive element comprise inductors.

7. A lumped element impedance transforming four-port directional coupler comprising:

a first reactive element;

a second reactive element coupled to the first reactive element at a first node;

a third reactive element coupled to the second reactive element at a second node;

a fourth reactive element coupled to the third reactive element at a third node and to the first reactive element at a fourth node, such that the first reactive element is coupled between the first and fourth nodes, the second reactive element is coupled between the first and second nodes, the third reactive element is coupled between the second and third nodes, and the fourth reactive element is coupled between the third and fourth nodes;

the first, the second, the third, and the fourth nodes each coupled through a first, a second, a third, and a fourth capacitor, respectively, to an electrical ground; and a first port, a second port, a third port, and a fourth port coupled through a first lumped element impedance, a second lumped element impedance, a third lumped element impedance, and a fourth lumped element impedance, respectively, to the first node, the second node, the third node and the fourth node, respectively, to provide impedance transformation for the four-port directional coupler, wherein each of the first and second lumped element impedances have a first impedance value.

8. A lumped element directional coupler as claimed in claim 7 wherein each of the third and fourth lumped element impedances have a second impedance value.

9. A lumped element directional coupler as claimed in claim 8 wherein the first reactive element, the second reactive element, the third reactive element and the fourth reactive element each comprise an inductor.

10. A distributed impedance transforming directional coupler comprising:

a first port;

a second port;

a first transmission line coupled between the first port and the second port, the first transmission line having a length which is one-fourth of a wavelength at a center operating frequency signal;

a third port;

a second transmission line coupled between the second port and the third port, the second transmission line having a length which is three-fourths of the wavelength at the center operating frequency signal;

a fourth port;

a third transmission line coupled between the fourth port and the third port, the third transmission line having a length which is one-fourth of the wavelength at the center operating frequency signal; and a fourth transmission line coupled between the fourth port and the first port, the fourth transmission line having a length which is three-fourths of the wavelength at the center operating frequency signal, the first, the second, the third, and the fourth transmission lines providing impedance transformation.

11. A lumped element impedance transforming four-port directional coupler comprising:

a first reactive element;

a second reactive element coupled to the first reactive element at a first node;

a third reactive element coupled to the second reactive element at a second node;

a fourth reactive element coupled to the third reactive element at a third node and to the first reactive element at a fourth node, such that the first reactive element is coupled between the first and fourth nodes, the second reactive element is coupled between the first and second nodes, the third reactive element is coupled between the second and third nodes, and the fourth reactive element is coupled between the third and fourth nodes;

the third and the fourth nodes coupled through a first and a second inductor, respectively, to an electrical ground; and a first port, a second port, a third port, and a fourth port coupled through a first impedance, a second impedance, a third impedance, and a fourth impedance, respectively, to the first node, the second node, the third node and the fourth node, respectively, providing impedance transformation for the four-port directional coupler.

12. A lumped element directional coupler as claimed in claim 11, wherein:

the first and second impedance each have a first impedance value;

the third and the fourth impedances each have a second impedance value of approximately twice the first impedance value;

the first and the second inductor have approximately equal inductance;

the first reactive element and the third reactive element comprise capacitors which each have approximately equal capacitance; and the second reactive element and the fourth reactive element comprise inductors.

13. A lumped element impedance transforming four-port directional coupler comprising:
   a first reactive element;
   a second reactive element coupled to the first reactive element at a first node;
   a third reactive element coupled to the second reactive element at a second node;
   a fourth reactive element coupled to the third reactive element at a third node and to the first reactive element at a fourth node, such that the first reactive element is coupled between the first and fourth nodes, the second reactive element is coupled between the first and second nodes, the third reactive element is coupled between the second and third nodes, and the fourth reactive element is coupled between the third and fourth nodes;
   the first, the second, the third, and the fourth nodes each coupled through a first, a second, a third, and a fourth admittance, respectively, to an electrical ground; and
   a first port, a second port, a third port, and a fourth port coupled through a first lumped element impedance, a second lumped element impedance, a third lumped element impedance, and a fourth lumped element impedance, respectively, to the first node, the second node, the third node and the fourth node, respectively, providing impedance transformation for the four-port directional coupler, wherein each of the first and second lumped element impedances have a first impedance value.

14. A lumped element directional coupler as claimed in claim 13, wherein each of the third and the fourth lumped element impedances have a second impedance value.

15. A lumped element directional coupler as claimed in claim 14, wherein the first reactive element and the third reactive element comprise capacitors having approximately equal capacitance.

16. A lumped element directional coupler as claimed in claim 15, wherein the second reactive element and the fourth reactive element comprise inductors.

17. A lumped element directional coupler as claimed in claim 13, wherein each of the third and the fourth lumped element impedances have a second impedance value.

18. A lumped element directional coupler as claimed in claim 17, wherein each of the first reactive element and the third reactive element comprise inductors having approximately equal inductance.

19. A lumped element directional coupler as claimed in claim 18, wherein the second reactive element and the fourth reactive element comprise capacitors.

* * * * *

UNITED STATES PATENT AND TRADEMARK OFFICE
CERTIFICATE OF CORRECTION

PATENT NO.  : 5,304,961
DATED       : April 19, 1994
INVENTOR(S) : Michael Dydyk It is certified that error appears in the above-indentified patent and that said Letters Patent is hereby corrected as shown below:

In column 8, claim 1, lines 26 and 27, change the word "reaction" to --reactive--.

Signed and Sealed this

Twenty-fourth Day of January, 1995

Attest:

BRUCE LEHMAN

Attesting Officer

Commissioner of Patents and Trademarks